United States Patent
Liu et al.

(10) Patent No.: US 8,312,359 B2
(45) Date of Patent: Nov. 13, 2012

(54) BRANCH-METRIC CALIBRATION USING VARYING BANDWIDTH VALUES

(75) Inventors: Jingfeng Liu, Longmont, CO (US); Hongwei Song, Longmont, CO (US); Lingyan Sun, Longmont, CO (US)

(73) Assignee: LSI Corporation, Milpitas, CA (US)

( * ) Notice: Subject to any disclaimer, the term of this patent is extended or adjusted under 35 U.S.C. 154(b) by 561 days.

(21) Appl. No.: 12/562,200

(22) Filed: Sep. 18, 2009

(65) Prior Publication Data

US 2011/0072335 A1 Mar. 24, 2011

(51) Int. Cl.
*H03M 13/03* (2006.01)
*G06F 11/00* (2006.01)

(52) U.S. Cl. ........................................ 714/796

(58) Field of Classification Search .................. 714/792, 714/795, 796
See application file for complete search history.

(56) References Cited

U.S. PATENT DOCUMENTS

| | | | | | |
|---|---|---|---|---|---|
| 4,606,027 | A | * | 8/1986 | Otani | 714/795 |
| 5,757,855 | A | * | 5/1998 | Strolle et al. | 375/262 |
| 6,473,472 | B1 | * | 10/2002 | Uchiki et al. | 375/341 |
| 6,631,494 | B2 | * | 10/2003 | Patapoutian | 714/788 |
| 6,637,004 | B1 | * | 10/2003 | Mizuno et al. | 714/796 |
| 6,785,212 | B1 | * | 8/2004 | Sim et al. | 369/59.22 |
| 7,194,674 | B2 | * | 3/2007 | Okumura et al. | 714/795 |

* cited by examiner

*Primary Examiner* — James C Kerveros
(74) *Attorney, Agent, or Firm* — Mendelsohn, Drucker & Associates, P.C.; Craig M. Brown; Steve Mendelsohn

(57) ABSTRACT

In one embodiment, a signal processing receiver has a branch-metric calibration (BMC) unit that receives (i) sets of four hard-decision bits from a channel detector and (ii) a noise estimate. The BMC unit has two or more update blocks (e.g., tap-weight update and/or bias-compensation blocks) that generate updated parameters used by a branch-metric unit of the channel detector to improve channel detection. The two or more update blocks generate the updated parameters based on (i) the sets of four hard-decision bits, (ii) the noise estimate, and (iii) bandwidth values. The bandwidth values for at least two of the two or more update blocks are selected such that they are different from one another. Selecting different bandwidth values may reduce the bit-error rate for the receiver over the bit-error rate that may be achieved by selecting the bandwidth values to be the same as one another.

20 Claims, 5 Drawing Sheets

BRANCH-METRIC CALIBRATION USING VARYING BANDWIDTH VALUES

BACKGROUND OF THE INVENTION

1. Field of the Invention

The present invention relates to channel detectors of signal processing receivers, and, in particular, to calibrating parameters used by such channel detectors.

2. Description of the Related Art

In conventional hard-disk drive (HDD) systems, binary ones and zeros are written to HDD platters as magnetic flux reversals. To read the ones and zeros from the disk, a conventional read head detects voltage peaks imparted on the read head when a flux reversal passes underneath the read head. A push by HDD system manufacturers to increase the amount of data that may be stored on HDD platters (i.e., increase the storage density) has resulted in packing data more closely together on the HDD platters. Increasing storage density results in pushing peaks closer together, making it more difficult for HDD systems to detect flux reversals. To combat this issue, partial-response maximum-likelihood (PRML) methods were developed. Rather than looking for peaks, PRML methods sample the analog waveform that the read head detects from the platter. Then, PRML methods use signal processing technologies, such as error detection and error correction, to determine the bit pattern represented by the waveform. As a result of these signal processing technologies, HDD systems that employ PRML methods are typically capable of interpreting smaller changes in the analog signal than equivalent HDD systems that use peak detection. This allows data to be packed closer together, thereby increasing storage densities, while maintaining or even possibly improving error rates of HDD systems.

SUMMARY OF THE INVENTION

In one embodiment, the present invention is an apparatus comprising a branch-metric calibration unit that updates channel-detection parameters used by a channel detector for channel detection. The branch-metric calibration unit comprises at least two parameter update blocks. A first of the parameter update blocks is a first tap-weight update block that updates a set of tap weights based on (i) hard-decision bits received from the channel detector, (ii) an error signal, and (iii) a first set of one or more bandwidth parameters. The first set includes all of the one or more bandwidth parameters for the first tap-weight update block. A second of the parameter update blocks updates a set of channel-detection parameters based on (i) the hard-decision bits, (ii) the error signal, and (iii) a second set of one or more bandwidth parameters. The second set includes all of the one or more bandwidth parameters for the second parameter update block, and all values of the one or more bandwidth parameters in the first set are different from all values of the one or more bandwidth parameters in the second set.

In another embodiment, the present invention is a method, implemented by a branch-metric calibration unit, for updating channel-detection parameters used by a channel detector for channel detection. The method comprises the branch-metric calibration unit updating a set of tap weights based on (i) hard-decision bits received from the channel detector, (ii) an error signal, and (iii) a first set of one or more bandwidth parameters. The first set includes all of the one or more bandwidth parameters used to update the set of tap weights. The method also comprises the branch-metric calibration unit updating a set of the channel-detection parameters based on (i) the hard-decision bits, (ii) the error signal, and (iii) a second set of one or more bandwidth parameters. The second set includes all of the one or more bandwidth parameters used to update the set of channel-detection parameters, and all values of the one or more bandwidth parameters in the first set are different from all values of the one or more bandwidth parameters in the second set.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Figure 1:
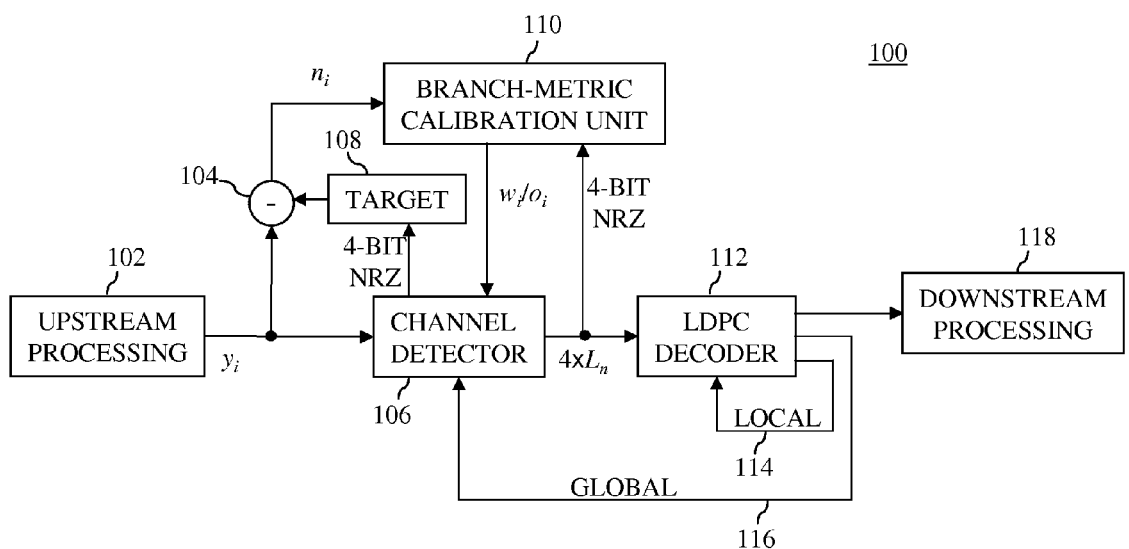
FIG. 1 shows a simplified block diagram of a partial-response maximum-likelihood (PRML) signal processing receiver according to one embodiment of the present invention.

FIG. 1 shows a simplified block diagram of a partial-response maximum-likelihood (PRML) signal processing receiver 100 according to one embodiment of the present invention. Signal processing receiver 100 may be implemented in a communications system, a data storage system such as a hard-disk drive (HDD) system, or any other suitable signal processing system. Receiver 100 has upstream processing 102, the operations of which may vary from one system to the next. For example, in a hard-disk drive (HDD) system, upstream processing 102 may perform amplification, analog-to-digital conversion, equalization, and other processing suitable for (i) retrieving a data stream from a HDD platter and (ii) preparing the data stream for channel detection.

The retrieved data stream is processed by channel detector 106, which implements a suitable data detection technique such as Viterbi soft-output detection. Channel detector 106 operates at one quarter of the data rate to generate four channel soft-output values $L_n$ (e.g., log-likelihood ratios (LLRs)) at a time i, each corresponding to one bit of the retrieved data stream. Each channel soft-output value $L_n$ comprises a hard-decision bit $b_{i-j}$, (i.e., the most-significant bit) and one or more confidence-value bits (i.e., least-significant bits). Channel detector 106 provides a non-return-to-zero (NRZ) sequence comprising four hard-decision bits $b_{i-j}$, j=0, ..., 3, corresponding to four channel soft-output values $L_n$ to both branch-metric calibration unit 110 and target block 108. Additionally, channel detector 106 provides four channel soft-output values $L_n$ to low-density parity-check (LDPC) decoder 112.

In signal processing systems, noise and distortion are often introduced into a retrieved signal. For example, in HDD systems, noise and distortion are often introduced to signals that are read back from the HDD platter by read heads and magnetic media. This noise and distortion often correlates with the written user data. Branch-metric calibration unit 110 adapts to these correlations and distortion. In so doing, branch-metric calibration unit 110 generates tap weights $w_{i,j}$ and bias estimates $o_i$ based on (i) a noise estimate $n_i$ received from combiner 104 and (ii) NRZ bits received from channel detector 106. A discussion of the operation of branch-metric calibration unit 110 is discussed below in relation to FIG. 2. The tap weights $w_{i,j}$ and bias estimates $o_i$ are provided to channel detector 106, and are used by a branch-metric unit of channel detector 106 to improve the error rate of signal processing system 100.

Target block 108 and combiner 104 together generate noise estimate $n_i$ as shown below in Equation (1):

$$n_i = y_i - \sum_{j=0}^{e-1} t_j \tilde{b}_{i-j} \quad (1)$$

In particular, target block 108 convolves a bi-polar NRZ estimate $\tilde{b}_{i-j}$ of the hard-decision bits $b_{i-j}$, where $\tilde{b}_{i-j}=b_{i-j}-\frac{1}{2}$, with a target $[t_0, t_1, \ldots, t_{e-1}]$, where e=the length of the target, as shown to the right of the subtraction sign in Equation (1). Combiner 104 generates noise estimate $n_i$ at time i by subtracting the output of target block 108 from the samples $y_i$ received from upstream processing 102. The noise estimate $n_i$ is then provided to branch-metric calibration unit 110.

LDPC decoder 112 attempts to recover LDPC-encoded codewords from sets of channel soft-output values. If LDPC decoder 112 is successful at recovering an LDPC-encoded codeword, then a set of hard-decision bits is provided to downstream processing 118, which may include, for example, a controller, a user application, and any other suitable processing. If LDPC decoder 112 is not successful at recovering an LDPC-encoded codeword, then receiver 100 may perform additional local iterations (i.e., iterations of LDPC decoder 112) and/or global iterations (i.e., iterations of channel detector 106 and LDPC decoder 112 together) to recover the LDPC-encoded codeword. For each additional local iteration, a set of updated soft-output values that were generated during the prior iteration are provided back to LDPC decoder 112 via feedback path 114, and LDPC decoder 112 attempts to recover the LDPC-encoded codeword using the set of updated soft-output values. For each additional global iteration, a set of extrinsic soft-output values generated by LDPC decoder 112 are provided back to channel detector 106 via feedback path 116. The extrinsic soft-output values are utilized to improve the detection capabilities of channel detector 106.

Figure 2:
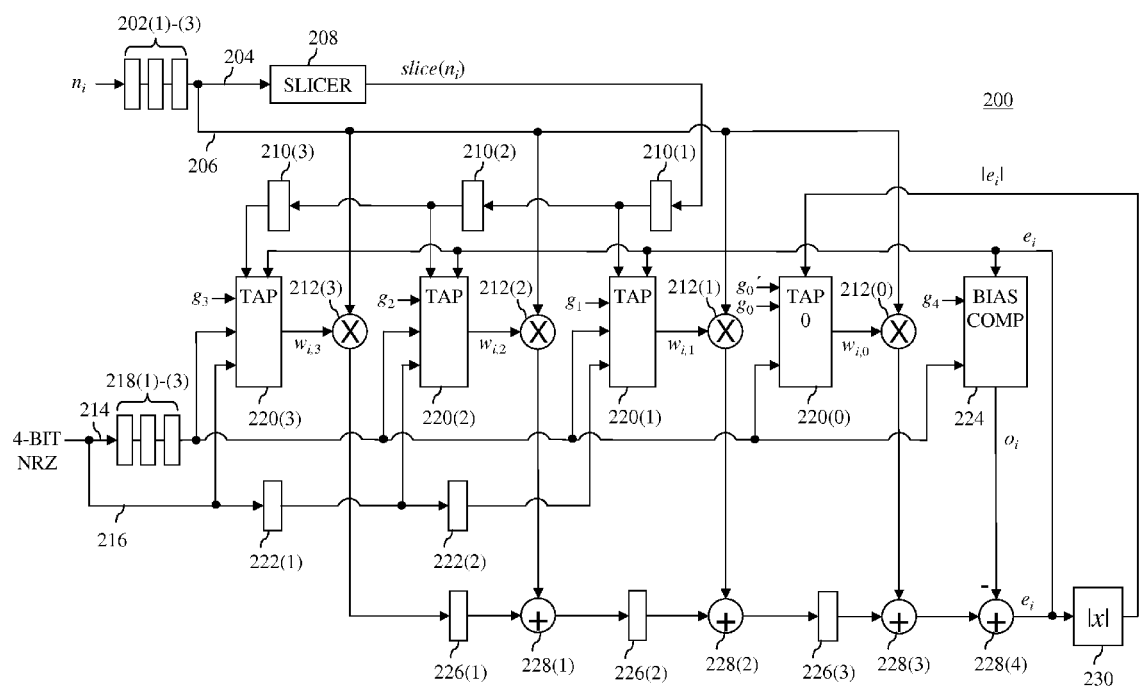
FIG. 2 shows a simplified block diagram of a branch-metric calibration unit according to one embodiment of the present invention that may be used to implement the branch-metric calibration unit in FIG. 1.

FIG. 2 shows a simplified block diagram of a branch-metric calibration unit 200 according to one embodiment of the present invention that may be used to implement branch-metric calibration unit 110 in FIG. 1. Branch-metric calibration unit 200 is a signal-dependent, bias-compensated, adaptive noise predictive finite-impulse response (FIR) filter. Branch-metric calibration unit 200 receives (i) noise estimate $n_i$ from, for example, combiner 104 of FIG. 1, and (ii) an NRZ sequence of four hard-decision bits ($b_{i-3}, \ldots b_i$) from a channel detector such as channel detector 106 of FIG. 1, and optimizes tap weights $w_{i,j}$ and bias estimate $o_i$, which are used, for example, in the branch-metric calculation of channel detector 106.

Noise estimate $n_i$ is delayed by buffers 202(1)-(3) and processed via a lower noise-estimate path 206 and an upper noise-estimate path 204. In lower noise-estimate path 206, the delayed noise estimate is provided directly to multipliers 212(0)-(3). In the upper noise-estimate path 204, the delayed noise estimate $n_i$ is provided to slicer 208, which slices noise estimate $n_i$ as shown below in Equation (2):

$$\text{slice}(n_i) = \begin{cases} -1 & \text{if } n_i < -3, \\ 0 & \text{if } -3 \le n_i \le 3, \\ 1 & \text{if } n_i > 3. \end{cases} \quad (2)$$

As shown in Equation (2), if noise estimate $n_i$ is less than −3, then a value of −1 is output from slicer 208. If noise estimate $n_i$ is greater than or equal to −3 and less than or equal to 3, then a value of 0 is output from slicer 208. If noise estimate $n_i$ is greater than 3, then a value of 1 is output from slicer 208. The sliced noise estimate (slice($n_i$)) is then delayed by buffer 210(1) and is subsequently provided to positive-delay tap update block 220(1) and buffer 210(2). After being delayed by buffer 210(2), the sliced noise estimate is provided to positive-delay tap update block 220(2) and buffer 210(3), and, after being delayed by buffer 210(3), the sliced noise estimate is provided to positive-delay tap update block 220(3).

The NRZ sequence of four hard-decision bits ($b_{i-3}, \ldots b_i$) is processed via an upper NRZ path 214 and a lower NRZ path 216. In upper NRZ path 214, the NRZ sequence is delayed by buffers 218(1)-(3), and the delayed NRZ sequence is provided to (i) positive-delay tap update blocks 220(1)-(3), (ii) zero-delay tap update block 220(0), and (iii) bias-compensation block 224. In lower NRZ path 216, the NRZ sequence ($b_{i-3}, \ldots, b_i$) is provided to positive-delay tap update block 220(3) and to buffer 222(1). After being delayed by buffer 222(1), the NRZ sequence ($b_{i-3}, \ldots, b_i$) is provided to positive-delay tap update block 220(2) and buffer 222(2), and, after being delayed by buffer 222(2), the NRZ sequence ($b_{i-3}, \ldots, b_i$) is provided to positive-delay tap update block 220(1). In general, each positive-delay tap update block 220 generates updated tap weights $w_{i,j}$ based on (i) an error signal $e_i$ received from combiner 228(4), (ii) sliced noise estimate (slice($n_i$)), and (iii) two differently delayed NRZ sequences (i.e., one received via upper path 214 and the other received lower path 216).

Figure 3:
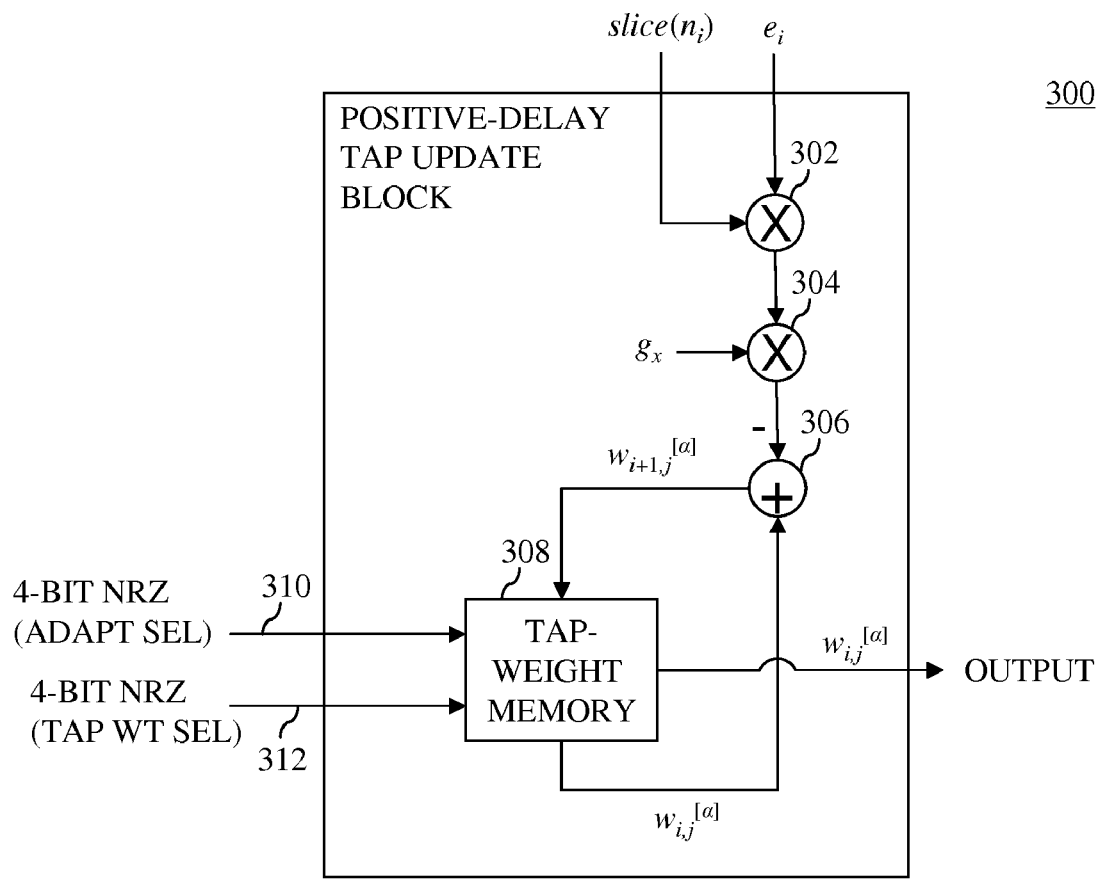
FIG. 3 shows a simplified block diagram of a positive-delay tap according to one embodiment of the present invention that may be used to implement each positive-delay tap in FIG. 2.

FIG. 3 shows a simplified block diagram of a positive-delay tap update block 300 according to one embodiment of the present invention that may be used to implement each positive-delay tap 220 in FIG. 2. Positive-delay tap update block 300 has tap-weight memory 308, which may be implemented as dual-read, single-write memory having eight registers. Each of the eight registers stores a tap weight $w_{i,j}^{[\alpha]}$ corresponding to a different one of eight NRZ filtering conditions $\alpha_k$, where k=0, ..., 7 and $\alpha_0 \in \{0000, 1111\}$, $\alpha_1 \in \{1000, 0111\}, \ldots, \alpha_7 \in \{0111, 1000\}$. Note that each filtering condition $\alpha_k$ comprises two polar-opposite, four-bit NRZ sequences (e.g., $\alpha_k \in \{b_{-3}b_{-2}b_{-1}b_0, \overline{b_{-3}b_{-2}b_{-1}b_0}\}$) and $\alpha_0$ is referred to as the normalizing filtering condition. Tap-weight memory 308 receives a first set of four NRZ bits 310 from, for example, upper NRZ path 214 of FIG. 2. The first set of four NRZ bits 310 act as a first index signal that is used to select the appropriate register of tap-weight memory 308 to update. For example, if four-bit NRZ 310 is equal to {1111}, then the register corresponding to normalizing filtering condition $\alpha_0$ is selected since four-bit sequence {1111} is a member of set $\alpha_0$.

The tap weight $w_{i,j}^{[\alpha]}$ stored in the selected register (i.e., corresponding to filtering condition $\alpha_k$) is updated using multipliers 302 and 304 and combiner 306 as shown in Equation (3) below:

$$w_{i+1,j}^{\alpha} = w_{i,j}^{\alpha} - g_x \times \text{slice}(n_{i-j})e_i, (1 \leq j \leq c) \quad (3)$$

where c is the number of taps (e.g., c=4) and $g_x = g_1$, $g_2$, or $g_3$ (depending on whether positive-delay tap update block 300 implements positive-delay tap update block 220(1), 220(2), or 220(3) in FIG. 2). In particular, multiplier 302 multiplies the sliced nose estimate received from, for example, slicer 208 of FIG. 2, by error signal $e_i$ received from, for example, combiner 228(4). The product of multiplier 302 is then multiplied by a bandwidth $g_x$, which ranges from 0 to 1, and the resulting product is subtracted from tap weight $w_{i,j}^{[\alpha]}$ using combiner 306 to generate updated tap weight $w_{i+1,j}^{[\alpha]}$. The selection of bandwidth $g_x$ is discussed further below. Updated tap weight $w_{i+1,j}^{[\alpha]}$ is subsequently stored in the selected register (i.e., the register corresponding to filtering condition $\alpha_k$). During a servo event, all eight tap weights $w_{i,j}^{[\alpha]}$ (i.e., the tap weights corresponding to filtering conditions $\alpha_0, \ldots, \alpha_7$) are output to a channel detector such as channel detector 106. Note that, since updating is performed for only one NRZ filtering condition at a time i, multipliers 302 and 304 and combiner 306 may be shared by all eight registers of tap-weight memory 308 to update all eight tap weights $w_{i,j}^{[\alpha]}$. Further, at equilibrium:

$$E(n_{i-j}e_i | b_{i-3}, \ldots, b_i \in \alpha_k) = 0, (1 \leq j \leq c) \quad (4)$$

In other words, the expectation (i.e., E) of the product of noise estimate $n_{i-j}$ and error signal $e_i$ is zero given that the four NRZ bits ($b_{i-3}, \ldots, b_i$) correspond to a sequence of bits in one of filtering conditions $\alpha_k$.

In addition to generating updated tap weights $w_{i+1,j}^{[\alpha]}$, positive-delay tap update block 300 selects tap weights $w_{i,j}^{[\alpha]}$ to output to, for example, a multiplier 212 in FIG. 2. In particular, tap-weight memory 308 receives a second set of four NRZ bits 312 ($b_{i-3}, \ldots, b_i$) from, for example, lower NRZ path 216 of FIG. 2. The second set of four NRZ bits 312 act as a second index signal that is used to select the appropriate register to output. Note that, since NRZ bits 310 and 416 are differently delayed (e.g., NRZ paths 214 and 216 in FIG. 2 have different delays), at any given time i, NRZ bits 310 may differ from NRZ bits 312. As are result, two different registers of tap-weight memory 308 may be selected at a time, one in which the contents are updated and the other in which the contents are output.

Referring back to FIG. 2, the updated tap weights $w_{i,j}$ output by positive-delay tap update blocks 220(1)-(3) are multiplied by the differently delayed noise estimates $n_{i,j}$ using multipliers 212(1)-(3), respectively. The product generated by multiplier 212(3) is delayed by buffer 226(1) and is added by combiner 228(1) to the product generated by multiplier 212(2). The sum generated by combiner 228(1) is delayed by buffer 226(2) and added using combiner 228(2) to the product generated by multiplier 212(1). The sum generated by combiner 228(2) is delayed by buffer 226(3) and is added using combiner 228(3) to a product generated by multiplier 212(0).

The product generated by multiplier 212(0) is obtained by multiplying a tap weight $w_{i,0}$ output from zero-delay tap update block 220(0) by the delayed noise estimate $n_i$ received via lower noise-estimate path 206. In general, zero-delay tap update block 220(0) generates updated tap weights $w_{i,0}$ for each filtering condition $\alpha$ except $\alpha_0$ based on (i) a magnitude $|e_i|$ of error signal $e_i$ received from magnitude block 230 and (ii) a sequence of four hard-decision bits (i.e., $b_{i-3}, \ldots, b_i$) received via upper NRZ path 214. Note that tap weight $w_{i,0}^{[\alpha]}$ for normalizing filtering condition $\alpha_0$ is fixed at a value of one.

Figure 4:
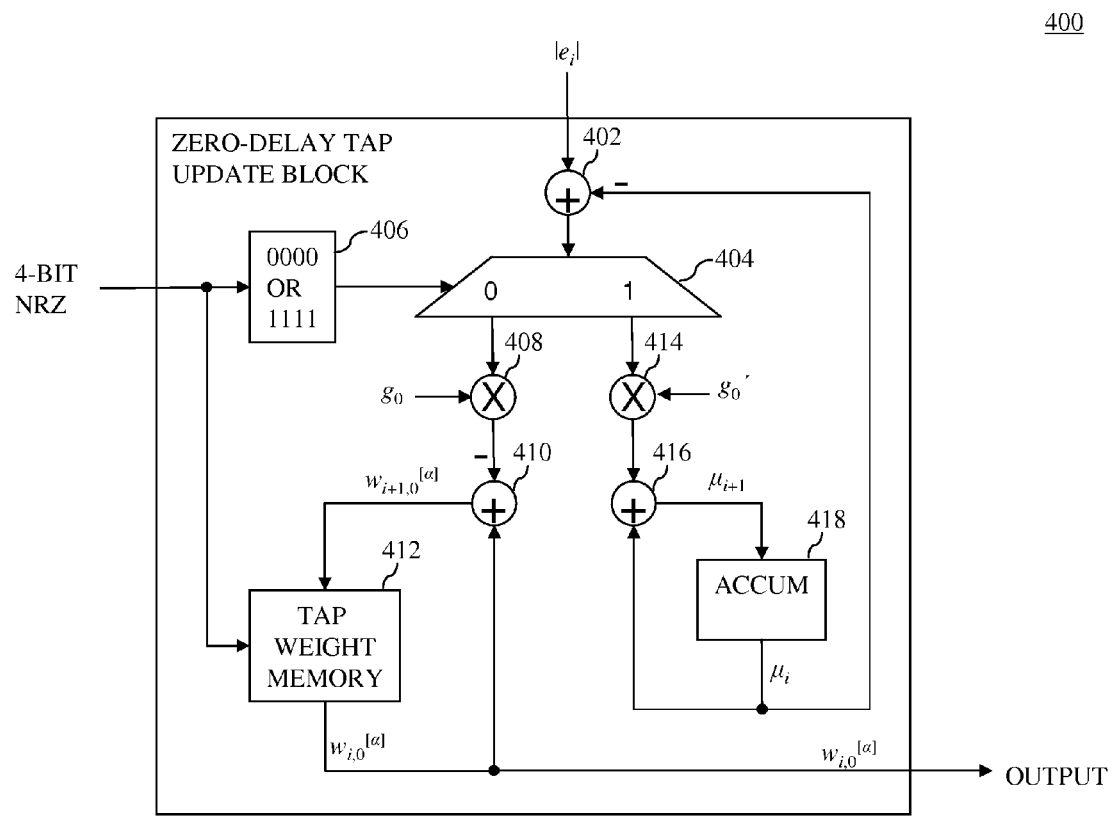
FIG. 4 shows a simplified block diagram of a zero-delay tap update block according to one embodiment of the present invention that may be used to implement the zero-delay tap update block in FIG. 2.

FIG. 4 shows a simplified block diagram of a zero-delay tap update block 400 according to one embodiment of the present invention that may be used to implement zero-delay tap update block 220(0) in FIG. 2. Zero-delay tap update block 400 implements (i) a first update loop comprising multiplier 408, combiner 410, and tap-weight memory 412, and (ii) a second update loop comprising multiplier 414, combiner 416, and accumulation block 418. In general, the first and second update loops, together, drive each tap weight $w_{i,0}^{[\alpha]}$ for each filtering condition $\alpha_k \neq \alpha_0$ to a stable value such that the expected square error $(\sigma^{[\alpha]})^2$ for filtering condition $\alpha_k \neq \alpha_0$ equals the expected square error $(\sigma_{[\alpha]})^2$ for normalizing filtering condition $\alpha_0$.

Zero-delay tap update block 400 receives (i) a magnitude $|e_i|$ of error signal $e_i$ from, for example, magnitude block 230 of FIG. 2 and (ii) a set of four NRZ bits ($b_{i-3}, \ldots, b_i$) from, for example, upper NRZ path 214 of FIG. 2. An accumulation value $\mu_i$ received from accumulation block 418 (discussed below) is subtracted from error magnitude $|e_i|$ by combiner 402, and the resulting difference (i.e., $|e_i| - \mu_i$) is provided to multiplexer 404. The output of multiplexer 404 is controlled by selector 406, which outputs a control signal based on the value of the set of four NRZ bits.

If the set of four NRZ bits ($b_{i-3}, \ldots b_i$) corresponds to one of the sequences of bits in normalizing filtering condition $\alpha_0$ (i.e., $b_{i-3}, \ldots, b_i \in \{0000, 1111\}$), then selector 406 outputs a value of one to multiplexer 404, which provides the difference (i.e., $|e_i| - \mu_i$) from combiner 402 to multiplier 414 of the second update loop. The second update loop, together with combiner 402, updates accumulation values $\mu_i$ as shown in Equation (5):

$$\mu_{i+1} = \begin{cases} \mu_i + g_0'(|e_i| - \mu_i) & \text{if } b_{i-3}, \ldots, b_i \in \alpha_0 \\ \mu_i & \text{otherwise} \end{cases} \quad (5)$$

In particular, if the four NRZ bits ($b_{i-3}, \ldots, b_i$) correspond to one of the sequences in normalizing filtering condition $\alpha_0$ (i.e., 0000 or 1111), then the difference from combiner 402 (i.e., $|e_i| - \mu_i$) is multiplied by bandwidth $g_0'$ using multiplier 414. The selection of bandwidth $g_0'$ is discussed further below. The resulting product is added using combiner 416 to accumulation value $\mu_i$ received from accumulator 418 to generate an updated accumulation value $\mu_{i+1}$, which is subsequently stored in accumulator 418. Note that, if the four NRZ bits ($b_{i-3}, \ldots b_i$) are not in the set {0000, 1111}, then the second update loop is not selected by multiplexer 404, and accumulation value $\mu_i$ is not updated as shown in the lower part of Equation (5).

The updated accumulation value $\mu_{i+1}$ may be saturated (not shown) such that updated accumulation value is greater than or equal to zero ($\mu_{i+1} \geq 0$). In such a case, accumulation value $\mu_i$ is a low-passed version of error magnitude $|e_i|$, restricted to cycles i when $b_{i-3}, \ldots, b_i \in \alpha_0$. This filtering of error magnitude $|e_i|$ for normalizing filtering condition $\alpha_0$ ensures that variations in $\mu_i$ from its mean are only weakly correlated with error magnitude $|e_i|$. Furthermore, it follows from Equation (5) that, at equilibrium:

$$\mu_i = E(|e_i| \| b_{i-3}, \ldots, b_i \in \alpha_0) \tag{6}$$

In other words, at equilibrium, the expectation (i.e., E) of error magnitude $|e_i|$ given that the four NRZ bits $(b_{i-3}, \ldots, b_i)$ correspond to a sequence of bits in normalizing filtering condition $\alpha_0$ is equal to accumulation value $\mu_i$.

If the set of four NRZ bits $(b_{i-3}, \ldots, b_i)$ corresponds to a sequence of bits in one of filtering conditions $\alpha_1, \ldots, \alpha_7$ (not in normalizing filtering condition $\alpha_0$), then selector 406 outputs a value of zero to multiplexer 404, which provides the difference (i.e., $|e_i| - \mu_i$) from combiner 402 to multiplier 408 of the first update loop. The first update loop, together with combiner 402, updates tap weights $w_{i,0}^{[\alpha]}$ as shown in Equation (7):

$$w_{i+1,0}^{[\alpha]} = \begin{cases} w_{i,0}^{[\alpha]} - g_0(|e_i| - \mu_i) & \text{if } b_{i-3}, \ldots, b_i \in \alpha_k \neq \alpha_0 \\ w_{i,0}^{[\alpha]} & \text{otherwise} \end{cases} \tag{7}$$

In particular, if the four NRZ bits correspond to a sequence of bits in filtering conditions $\alpha_1, \ldots, \alpha_7$ (not in normalizing filtering condition $\alpha_0$), then the difference from combiner 402 (i.e., $|e_i| - \mu_i$) is multiplied by bandwidth $g_0$ using multiplier 408. The selection of bandwidth $g_0$ is discussed further below. The resulting product is subtracted using combiner 410 from a tap weight $w_{i,0}^{[\alpha]}$ received from tap-weight memory 412 to generate an updated tap weight $w_{i+1,0}^{[\alpha]}$, which is subsequently stored in tap-weight memory 412. During a servo event, all seven tap weights $w_{i,0}^{[\alpha]}$ (i.e., the tap weights corresponding to filtering conditions $\alpha_1, \ldots, \alpha_7$) are output to a channel detector such as channel detector 106. If the four NRZ bits correspond to a sequence of bits in normalizing filtering condition $\alpha_0$, then the first loop is not selected by multiplexer 404, and tap weight $w_{i+1,0}^{[\alpha]}$ is not updated as shown in the lower part of Equation (7). Note that, from Equations (6) and (7), at equilibrium:

$$E(|e_i| \| b_{i-3}, \ldots, b_i \in (\alpha_k \neq \alpha_0)) = \mu_i = E(|e_i| \| b_{i-3}, \ldots, b_i \in \alpha_0), (\alpha_k). \tag{8}$$

Tap-weight memory 412 may be implemented as single-read, single-write memory having seven registers, where each of the seven registers stores a tap weight $w_{i,0}^{[\alpha]}$ corresponding to a different one of NRZ filtering conditions $\alpha_1, \ldots, \alpha_7$ (i.e., excluding $\alpha_0$). Tap-weight memory 412 receives the set of four NRZ bits that are input to zero-delay tap update block 400. The set of four NRZ bits $(b_{i-3}, \ldots, b_i)$ act as a control signal that is used to select the appropriate tap weight $w_{i,0}^{[\alpha]}$ of tap-weight memory 412 to update and output to, for example, multiplier 212(0) of FIG. 2.

Referring back to FIG. 2, the sum generated by combiner 228(3) is provided to combiner 228(4) along with a bias estimate $o_i$ generated by bias-compensation block 224. In general, bias-compensation block 224 generates the bias estimate $o_i$ based on (i) the delayed NRZ sequence received via upper NRZ path 214 and (ii) error signal $e_i$ received from combiner 228(4). Bias-compensation block 224 implements data-dependent offset control, and drives each conditional mean of error signal $e_i$ to zero. The bias estimate $o_i$ is subtracted from the output of combiner 228(3) to generate error signal $e_i$, which is subsequently provided to positive-delay tap update blocks 220(1)-(3), bias-compensation block 224, and magnitude block 230. Magnitude block 230 generates a magnitude $|e_i|$ of error signal $e_i$ and provides the error magnitude $|e_i|$ to zero-delay tap update block 220(0).

Figure 5:
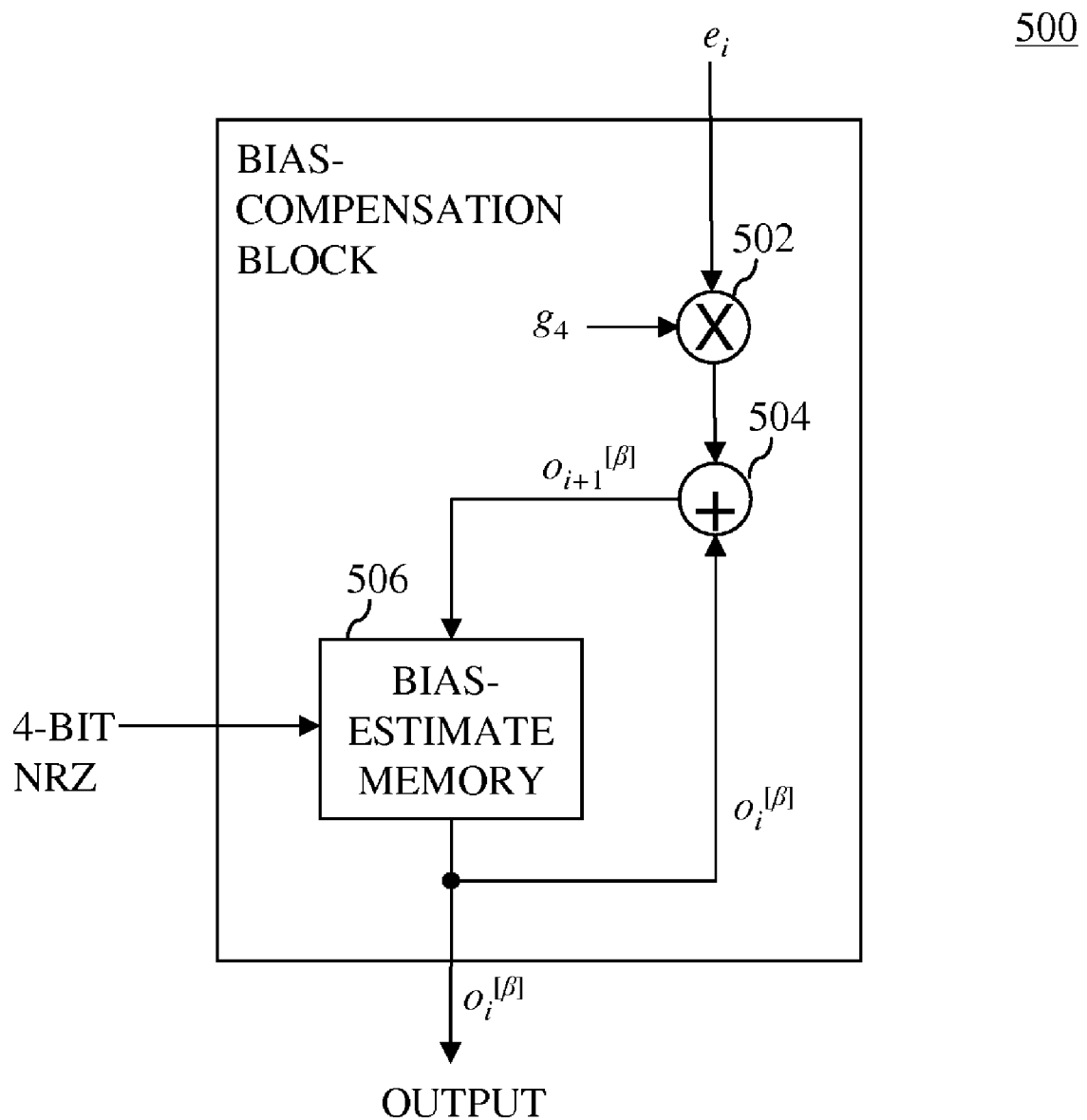
FIG. 5 shows a simplified block diagram of a bias-compensation block according to one embodiment of the present invention that may be used to implement the bias-compensation block in FIG. 2.

FIG. 5 shows a simplified block diagram of a bias-compensation block 500 according to one embodiment of the present invention that may be used to implement bias-compensation block 224 in FIG. 2. Bias-compensation block 500 receives (i) a set of four NRZ bits (i.e., $b_{i-3}, \ldots, b_i$) from, for example, upper NRZ path 214 of FIG. 2 and (ii) error signal $e_i$ from, for example, combiner 228(4), and generates an updated bias estimate $o_{i+1}^{[\beta]}$ as shown in Equation (9) below:

$$o_{i+1}^{[\beta]} = o_i^{[\beta]} + g_4 e_i \tag{9}$$

In particular, error signal $e_i$ is multiplied by bandwidth $g_4$ using multiplier 502. The selection of $g_4$ is discussed further below. The resulting product is added to a bias estimate $o_i^{[\beta]}$ received from bias-estimate memory 506 using combiner 504 to generate the updated bias estimate $o_{i+1}^{[\beta]}$, which is subsequently stored in bias-estimate memory 506.

Bias-estimate memory 506 may be implemented as single-read, single-write memory having 16-registers, one for each bias condition $\beta_n$, where n=0, ..., 15 and $\beta_0 \in \{0000\}$, $\beta_1 \in \{1000\}$, $\beta_3 \in \{0100\}, \ldots, \beta_{15} \in \{1111\}$. The set of four NRZ bits (i.e., $b_{i-3}, \ldots, b_i$) received by bias-compensation block 500 is used as a control signal to select the appropriate register of bias-estimate memory 506 to update. For example, suppose that the set of four NRZ bits (i.e., $b_{i-3}, \ldots, b_i$) corresponds to bias condition $\beta_0$. In this case, the bias estimate $o_i^{[\beta]}$ corresponding to $\beta_0$ is (i) updated and (ii) output to, for example, combiner 228(4) of FIG. 2 and the branch-metric unit of channel detector 106 in FIG. 1. The prior bias estimate $o_i^{[\beta]}$ stored in the register corresponding to bias condition $\beta_0$ is replaced by the updated bias estimate $o_{i+1}^{[\beta]}$. During a servo event, all sixteen bias estimates $o_i^{[\beta]}$ (i.e., the bias estimates corresponding to bias conditions $\beta_0, \ldots, \beta_{15}$) are output to a channel detector such as channel detector 106. Since only one bias condition $\beta_n$ holds on any bit cycle, the sixteen registers of bias-estimate memory 506 can share a single multiplier 502 and a single combiner 504. At equilibrium:

$$E(e_i | b_{i-3}, \ldots, b_i \in \beta_n) = 0, (\beta_n) \tag{10}$$

Considering Equation (10) together with Equation (8) above, and assuming that the noise is multivariate Gaussian, at equilibrium, it follows that:

$$E(|e_i|^2 \| b_{i-3}, \ldots, b_i \in (\alpha_k \neq \alpha_0)) = \mu_i = E(|e_i|^2 \| b_{i-3}, \ldots, b_i \in \alpha_0), (\alpha_k) \tag{11}$$

In prior-art branch-metric calibration units, the bandwidths $g_0, g_1, g_2, g_3,$ and $g_4$ in FIG. 2 are all set to the same bandwidth value g, which is determined experimentally and/or through simulations. Note that, in the prior art, bandwidth $g_0'$ in FIG. 2 is set to a value different from g. However, setting all of the bandwidths to the same bandwidth value might not yield an optimum bit-error rate (BER) for the signal processing system, especially when there is some degree of near direct-current (DC) noise present in the received signal. Rather than setting all of the bandwidths to the same bandwidth value, two or more of the bandwidths may be set to different bandwidth values to achieve improved BER. The two or more different bandwidth values may be selected through experimentation and/or simulations such that the two or more different bandwidth values yield a BER lower than that obtained when the same bandwidth value is used for all of the bandwidths.

According to various embodiments of the present invention, the two or more different bandwidth values may be completely independent from one another, such that selection of one bandwidth value does not depend on the selection of the other bandwidth values. For example, branch-metric calibration unit 200 may be implemented with six registers, one for each of $g_0, \ldots, g_4$ and $g_0'$ to enable different values to be specified for the different bandwidth values.

According to other embodiments, the two or more bandwidth values may be dependent on one another, such that selection of one bandwidth value depends on the selection of other bandwidth values. For example, the branch-metric calibration unit may be implemented with one register for specifying one of the bandwidth values (e.g., $g_0$). Then, the branch-metric calibration unit may generate the other bandwidth values (e.g., $g_1$, $g_2$, $g_3$, and $g_4$) based on the specified bandwidth value. For example, suppose that bandwidths $g_0$, $g_1$, $g_2$, $g_3$, and $g_4$ of FIG. 2 all have different values. The other bandwidth values (e.g., $g_1$, $g_2$, $g_3$, and $g_4$) could be generated such that the ratio between bandwidths $g_0$ and $g_1$ is the same as the ratio between bandwidths $g_1$ and $g_2$, which is the same as the ratio between bandwidths $g_2$ and $g_3$, which is the same as the ratio between bandwidths $g_3$ and $g_4$. As another example, the other bandwidth values (e.g., $g_1$, $g_2$, $g_3$, and $g_4$) could be generated such that the ratio between bandwidths $g_0$ and $g_1$ is different from the ratio between bandwidths $g_1$ and $g_2$, which is different from the ratio between bandwidths $g_2$ and $g_3$. In this case, the value of bandwidths $g_1$, $g_2$, and $g_3$ can also be set by setting the value of bandwidth $g_0$. As yet another example, the branch-metric calibration unit may be implemented to specify and/or generate bandwidth values based on a combination of any of the above mentioned approaches.

Although the present invention was described relative to a particular configuration of a branch-metric calibration unit (e.g., 200), the present invention is not so limited. The present invention may be implemented in branch-metric calibration units having other configurations. For example, the present invention may be implemented in branch-metric calibration units having more than or fewer than four taps. As another example, the present invention may be implemented in branch-metric calibration units having variable numbers of taps that may be varied from one use to the next or one implementation to the next. As yet another example, the present invention may be implemented in branch-metric calibration units that do not employ a bias-compensation block and/or a zero-delay tap update block.

Further, although the present invention was described relative to its use with HDD systems, the present invention is not so limited. The present invention may also be used in other signal processing systems such as communications systems.

The present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal processor, microcontroller, or general-purpose computer.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits. The present invention can also be embodied in the form of a bitstream or other sequence of signal values electrically or optically transmitted through a medium, stored magnetic-field variations in a magnetic recording medium, etc., generated using a method and/or an apparatus of the present invention.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

We claim:

1. An apparatus comprising a branch-metric calibration unit that updates channel-detection parameters used by a channel detector for channel detection, the branch-metric calibration unit comprising at least two parameter update blocks, wherein:
    a first parameter update block is a first tap-weight update block that updates a set of tap weights based on (i) hard-decision bits received from the channel detector, (ii) an error signal, and (iii) a first set of one or more bandwidth parameters, wherein the first set includes all of the one or more bandwidth parameters for the first tap-weight update block; and
    a second parameter update block updates a set of channel-detection parameters based on (i) the hard-decision bits, (ii) the error signal, and (iii) a second set of one or more bandwidth parameters, wherein:
        the second set includes all of the one or more bandwidth parameters for the second parameter update block; and all values of the one or more bandwidth parameters in the first set are different from all values of the one or more bandwidth parameters in the second set.

2. The apparatus of claim 1, comprising one or more additional parameter update blocks, wherein each additional parameter update block updates an additional set of channel-detection parameters based on (i) the hard-decision bits, (ii) the error signal, and (iii) an additional set of one or more bandwidth parameters, wherein the additional set includes all of the one or more bandwidth parameters for the additional parameter update block.

3. The apparatus of claim 2, wherein all values of the one or more bandwidth parameters corresponding to each additional parameter update block are different from all values of the bandwidth parameters corresponding to all other parameter update blocks.

4. The apparatus of claim 1, wherein the branch-metric calibration unit has a different register for each different bandwidth parameter to enable values to be specified independently for the different bandwidth parameters.

5. The apparatus of claim 1, wherein the branch-metric calibration unit (i) has a register and (ii) generates different values for two or more different bandwidth parameters based on a value stored in the register.

6. The apparatus of claim 5, comprising a third parameter update block that updates a third set of channel-detection parameters based on (i) the hard-decision bits, (ii) the error signal, and (iii) a third set of one or more bandwidth parameters, wherein:
all values of the one or more bandwidth parameters in the third set are different from all values of the bandwidth parameters in the first and second sets; and
a ratio between a value of a bandwidth parameter in the first set and a value of a bandwidth parameter in the second set is the same as a ratio between the value of the bandwidth parameter in the second set and a value of a bandwidth parameter in the third set.

7. The apparatus of claim 5, comprising a third parameter update block that updates a third set of channel-detection parameters based on (i) the hard-decision bits, (ii) the error signal, and (iii) a third set of one or more bandwidth parameters, wherein:
all values of the one or more bandwidth parameters in the third set are different from all values of the bandwidth parameters in the first and second sets; and
a ratio between a value of a bandwidth parameter in the first set and a value of a bandwidth parameter in the second set is different from a ratio between the value of the bandwidth parameter in the second set and a value of a bandwidth parameter in the third set.

8. The apparatus of claim 1, wherein the second parameter update block is a second tap-weight update block that updates a second set of tap weights.

9. The apparatus of claim 8, wherein a third parameter update block is a bias-compensation block that updates a set of bias estimates based on the hard-decision bits, the error signal, and a third set of one or more bandwidth parameters.

10. The apparatus of claim 9, wherein all values of the one or more bandwidth parameters corresponding to the bias-compensation block are different from all values of the bandwidth parameters corresponding to all other parameter update blocks.

11. The apparatus of claim 8, wherein the second tap-weight update block has a delay value that is different from a delay value of the first tap-weight update block.

12. The apparatus of claim 11, wherein one of the first and second tap-weight update blocks is a zero-delay tap-weight update block.

13. The apparatus of claim 8, wherein:
the first tap-weight update block outputs a first tap weight based on the hard-decision bits;
a first multiplier applies the first tap weight to a noise estimate to generate a first adjusted noise estimate;
the second tap-weight update block outputs a second tap weight based on the hard-decision bits;
a second multiplier applies the second tap weight to the noise estimate to generate a second adjusted noise estimate; and
the error signal is generated based on the first adjusted noise estimate and the second adjusted noise estimate.

14. The apparatus of claim 13, wherein:
a third parameter update block is a bias-compensation block that (i) updates a set of bias estimates based on the hard-decision bits and the error signal and (ii) outputs a current bias estimate based on the hard-decision bits; and
the error signal is further based on the current bias estimate.

15. The apparatus of claim 1, wherein:
the first tap-weight update block is a zero-delay update block that updates the set of tap weights based on the hard-decision bits, the error signal, a first bandwidth parameter corresponding to a normalizing filtering condition, and a second bandwidth parameter corresponding to filtering conditions other than the normalizing filtering condition;
the second parameter update block is a bias-compensation block that updates a set of bias estimates based on the hard-decision bits, the error signal, and a bias-compensation bandwidth parameter; and
the branch-metric calibration unit further comprises one or more positive-delay update blocks, each updating a corresponding set of tap weights based on the hard-decision bits, the error signal, and a corresponding positive-delay bandwidth parameter, wherein values for at least two of the second bandwidth parameter, bias-compensation bandwidth parameter, and positive-delay bandwidth parameter are different.

16. The apparatus of claim 15, wherein values for all of the second bandwidth parameter, bias-compensation bandwidth parameter, and positive-delay bandwidth parameter are different.

17. A method, implemented by a branch-metric calibration unit, for updating channel-detection parameters used by a channel detector for channel detection, the method comprising:
(a) the branch-metric calibration unit updating a set of tap weights based on (i) hard-decision bits received from the channel detector, (ii) an error signal, and (iii) a first set of one or more bandwidth parameters, wherein the first set includes all of the one or more bandwidth parameters used to update the set of tap weights; and
(b) the branch-metric calibration unit updating a set of channel-detection parameters based on (i) the hard-decision bits, (ii) the error signal, and (iii) a second set of one or more bandwidth parameters, wherein:
the second set includes all of the one or more bandwidth parameters used to update the set of channel-detection parameters; and
all values of the one or more bandwidth parameters in the first set are different from all values of the one or more bandwidth parameters in the second set.

18. The method of claim 17, wherein values for the different bandwidth parameters in the first and second sets are specified independently.

19. The method of claim 17, further comprising:
(c) the branch-metric calibration unit storing a value; and
(d) the branch-metric calibration unit generating different values for two or more different bandwidth parameters based on the stored value.

20. The invention method of claim 19, comprising:
(a1) applying a first tap weight in the set of tap weights to a noise estimate to generate a first adjusted noise estimate;
(b1) applying a channel-detection parameter in the set of channel-detection parameters to the noise estimate to generate a second adjusted noise estimate, wherein the set of channel-detection parameters is a second set of tap weights;
(c) updating a set of bias estimates based on the error signal, the hard-decision bits, and a third set of bandwidth parameters; and
(d) generating the error signal based on the first adjusted noise estimate, the second adjusted noise estimate, and a bias estimate in the set of bias estimates.

* * * * *